United States Patent [19]

Ichihara

[11] Patent Number: 5,466,976
[45] Date of Patent: Nov. 14, 1995

[54] TIME CONSTANT DETECTING CIRCUIT AND TIME CONSTANT ADJUSTING CIRCUIT

[75] Inventor: Masaki Ichihara, Tokyo, Japan

[73] Assignee: NEC Corporation, Japan

[21] Appl. No.: 997,500

[22] Filed: Dec. 28, 1992

[30] Foreign Application Priority Data

Dec. 26, 1991 [JP] Japan ................................. 3-357891

[51] Int. Cl.[6] ................................................. H03H 11/12
[52] U.S. Cl. ............................ 307/112; 333/173; 333/172
[58] Field of Search ................................. 333/167, 172,
333/173, 165, 19, 214; 307/241–242, 520–521,
112, 98, 100; 330/9, 51, 107, 109, 294;
327/403, 407, 551, 553; 363/62

[56] References Cited

U.S. PATENT DOCUMENTS

| | | | |
|---|---|---|---|
| 3,603,898 | 9/1971 | Dawson et al. | 333/70 |
| 4,498,063 | 2/1985 | Makabe et al. | 333/173 |
| 4,644,304 | 2/1987 | Temes | 333/173 |
| 4,743,872 | 5/1988 | Tanimoto | 333/173 |

Primary Examiner—Peter S. Wong
Assistant Examiner—Aditya Krishnan
Attorney, Agent, or Firm—Ostrolenk, Faber, Gerb & Soffen

[57] ABSTRACT

A time constant detecting circuit incorporated in an LSI detects variations of component values of resistors and capacitors in the LSI by detecting variations of a time constant. A pseudo-resistor is formed by a switched capacitor circuit and at least two switches which are alternately switched on and off in a period T to control a capacitor to be charged and discharged. With the operation of the capacitor having a capacitance C, there is formed a pseudo-resistor having a resistance $R_p = T/C$. A predetermined DC voltage is divided by a series circuit of the pseudo-resistor and an ordinary resistor, and smoothed by a capacitor. The output voltage $V_{out}$ which has been smoothed and appears at the output terminal is uniquely defined by a time constant $\tau = 1/RC$, so that the variations of the time constant which are dependent on the resistors and capacitors in the LSI can be detected by a measurement of the output voltage $V_{out}$.

20 Claims, 3 Drawing Sheets

5,466,976

TIME CONSTANT DETECTING CIRCUIT AND TIME CONSTANT ADJUSTING CIRCUIT

BACKGROUND OF THE INVENTION

1. Field of the Invention

The present invention relates to a time constant detecting circuit and a time constant adjusting circuit. The time constant detecting circuit serves to detect variations of a time constant of a circuit including resistors and capacitors such as, for example, an RC active filter incorporated in an LSI, and the time constant adjusting circuit serves to adjust the variations of such a time constant.

2. Description of the Prior Art

A monolithic LSI includes therein a circuit which incorporates resistors and capacitors as constituent elements such as, for example, an RC active filter. This however causes a problem in that the element values become very large in their absolute values, as well known in prior practice. More specifically, variations of element values of resistors and capacitors are as small as 1% or less in the same chip but are as large as 20%~40%, among different chips.

Construction of such an active filter using resistors and capacitors therefore causes variations of a cutoff frequency ranging from 40% to 100% if variations of such element values range within +/−30%, and thus the cutoff frequency is widely varied and it is very unlikely to produce filters which have a desired accuracy.

To solve such problems of the prior art, recent practice of the construction of filters incorporated in monolithic LSIs are made in the form of switched-capacitor filter type circuits instead of RC type ones. Such switched capacitor filter type circuits, however, surely require using prevention filters and smoothing filters at a preceding stage and at a following stage because of a sampling type construction, which filters, must be constructed with RC active filters respectively. The aforementioned variations of cutoff frequency are thus inevitable and bring about several severe problems in designing a circuit.

SUMMARY OF THE INVENTION

It is an object of the present invention to provide a time constant detecting circuit capable of detection of variations of element values in the form of an time constant of a RC circuit in view of the fact that resistors and capacitors formed in an LSI have very small errors in their element values.

It is another object of the present invention to provide a time constant adjusting circuit capable of ensuring fine adjustment of such an element value on the basis of a result of detection by the time constant detecting circuit.

In order to achieve the above-mentioned objects, a time constant detecting circuit and a time constant adjusting circuit according to the present invention are arranged as follows:

A time constant detecting circuit of the invention incorporated in an LSI as part of an associated circuit comprises a voltage dividing resistor circuit composed of a series circuit of a pseudo-resistor formed with a switched capacitor circuit and of an ordinary resistor for dividing applied predetermined DC voltage; and a smoothing capacitor for smoothing divided voltage from the voltage divider resistor circuit.

A time constant adjusting circuit of the invention incorporated in an LSI as part of an associated circuit comprises the time constant detecting circuit of the present invention; a judgement circuit for judging the range of voltage output by the time constant detecting circuit and outputting a control signal in response to the range judged by the judgment circuit; and means disposed in an associated circuit including resistors and capacitors as constituent elements thereof for altering the values of corresponding resistors and capacitors by receiving the control signal.

The time constant detecting circuit and the time constant adjusting circuit of the present invention arranged as described above function as follows:

In accordance with the time constant detecting circuit of the invention, the switched capacitor circuit, although it may be constructed in various forms, comprises a capacitor and a plurality of analog switches for charging and discharging the capacitor in a period of T [sec], the resistance Rp of the pseudo-resistor being Rp=T/C and the capacitance of the capacitor assumed to be C. Predetermined voltage is divided by a series circuit of the pseudo-resistor of Rp and an ordinary resistor and is further smoothed through a smoothing capacitor. The smoothed voltage is uniquely defined by a time constant $\tau=1/RC$.

More specifically, the present circuit can detect the variations of values of elements such as resistors and capacitors formed in an LSI as variations of the time constant $\tau$. These variations are effectual as data to estimate the variations of the characteristics of a circuit including resistors and capacitors because the relative error in the same chip is very small.

In accordance with the time constant adjusting circuit of the invention, the range of the output voltage from the time constant detecting circuit is judged and in response to the judged range values of corresponding resistors and capacitors in an object circuit are altered and finely adjusted. More specifically, upon incorporation of a desired RC active filter in an LSI, the cutoff frequency of the circuit is automatically made adjustable.

BRIEF DESCRIPTION OF THE DRAWINGS

The above and other objects, features and advantages of the present invention will be better understood from reading the following description of the preferred embodiments taken in connection with the accompanying drawings in which.

DETAILED DESCRIPTION OF PREFERRED EMBODIMENTS

In the following, the present invention will be described with reference to the accompanying drawings.

Figure 1:
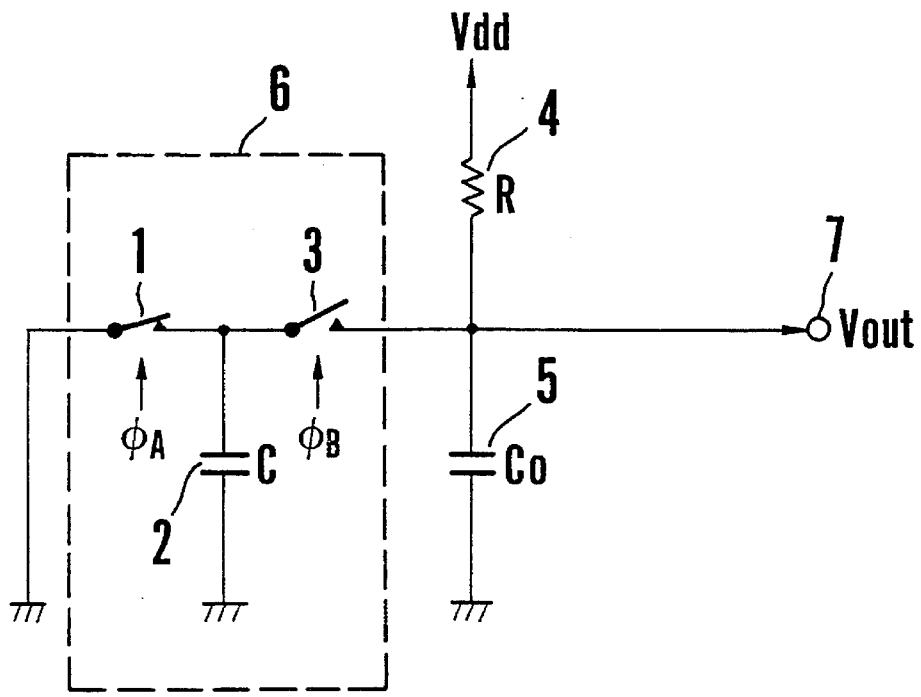
FIG. 1 is a circuit diagram of a time constant detecting circuit according to a first embodiment of the present invention.

Referring to FIG. 1, there is illustrated a time constant detecting circuit according to the first embodiment of the present invention. In the first embodiment circuit, a series circuit of an ordinary resistor 4 and a pseudo-resistor 6 forms a resistance voltage dividing circuit in which the ordinary resistor 4 is disposed on the side of a DC power supply and the pseudo-resistor 6 is disposed on the side of ground, and a smoothing capacitor 5 is provided between a junction (an output terminal 7) between both resistors 4 and 6 and the ground. For the DC power supply, either an power supply for a LSI or other DC power supply may be available.

The pseudo-resistor 6 is constructed with a parallel type switched capacitor circuit in the present embodiment. More specifically, the pseudo-resistor 6 comprises a charging/discharging capacitor 2 connected at its one end to the ground, an analog switch 1 disposed between the other end of the capacitor 2 and the ground, and an analog switch 3 disposed between the other end of the capacitor 2 and the output terminal 7 of the present resistance dividing circuit.

Figure 2:
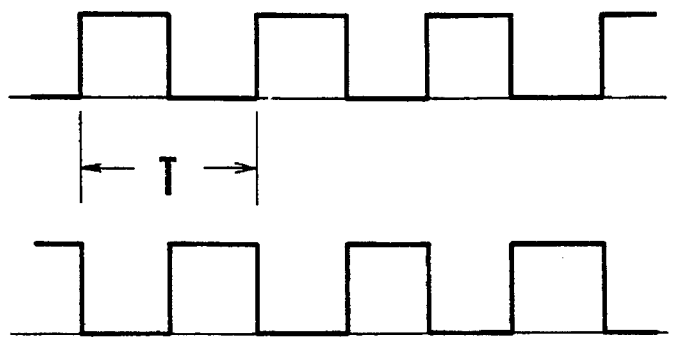
FIG. 2 is opening/closing control signals for opening/closing an analog switch illustrated in FIG. 1.

In the switched capacitor circuit, the analog switches 1, 3 are alternatively switched on and off in a period of T [sec] in conformity with opening/closing control signals $\phi_A$ and $\phi_B$ illustrated in FIG. 2 to control the capacitor 2 being charged and discharged. When it is assumed that the capacitance of the capacitor 2 is C and the terminal voltage (divided output voltage of the resistance voltage dividing circuit) of the capacitor 5 is Vout, a current I expressed by an expression:

$$I=C \cdot Vout/T [A]$$

equivalently flows owing to the operation of the capacitor 2 from the output terminal 7 through the capacitor 5 to the ground during an interval when the analog switch 3 is closed.

Accordingly, the resistance Rp of the pseudo-resistance 6 is expressed by an expression:

$$Rp=T/C [\Omega]$$

The output voltage Vout appearing at the output terminal 7 after being smoothed by the capacitor 5 is hereby expressed by:

$$Vout=Vdd \cdot (T/C)/\{T/(C+R)\} [V]$$

Herein, Vdd is voltage of the DC power supply and R is a resistance of the ordinary resistor 4. The expression is changed to:

$$Vout=Vdd \cdot \tau/\{\tau+(1/T)\} [V]$$

using a time constant $\tau(\tau=1/RC)$.

In other words, the mean output voltage Vout is uniquely defined by the time constant $\tau$ formed with the ordinary resistor 4 and the capacitor 2, and it follows that with a measurement of the voltage Vout, the time constant $\tau$ can be estimated and detected.

Figure 3:
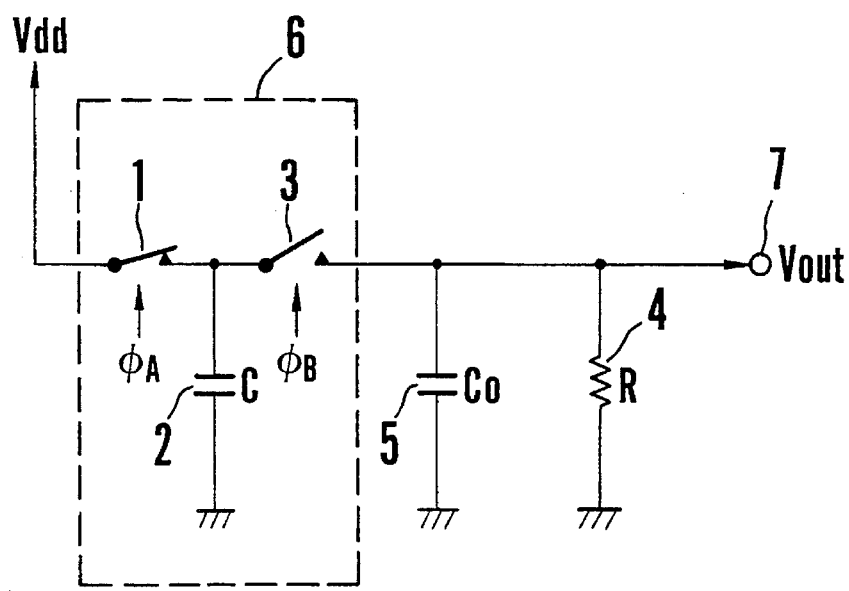
FIG. 3 is a circuit diagram of a time constant detecting circuit according to a second embodiment of the present invention.

Referring to FIG. 3, there is illustrated a time constant detecting circuit according to the second embodiment of the present invention.

In the second embodiment circuit, locations of the ordinary resistor 4 and the pseudo-resistor 6 are changed so that the pseudo-resistor 6 is disposed on the side of the DC power supply and the ordinary resistor 4 is disposed on the side of the ground. In the second embodiment circuit, a current I expressed by:

$$I=C \cdot (Vdd-Vout)/T [A]$$

equivalently flows from the DC power supply (Vdd) to the output terminal 7.

The output voltage Vout is accordingly expressed by:

$$Vout=Vdd \cdot R/\{(T/C)+R\} [V],$$

which is rewritten as:

$$Vout=Vdd \cdot (1/T)/\{\tau+(1/T)\} [V]$$

using the time constant $\tau$. It is thus understood that the time constant can be detected as in the case of the first embodiment circuit.

Figure 4:
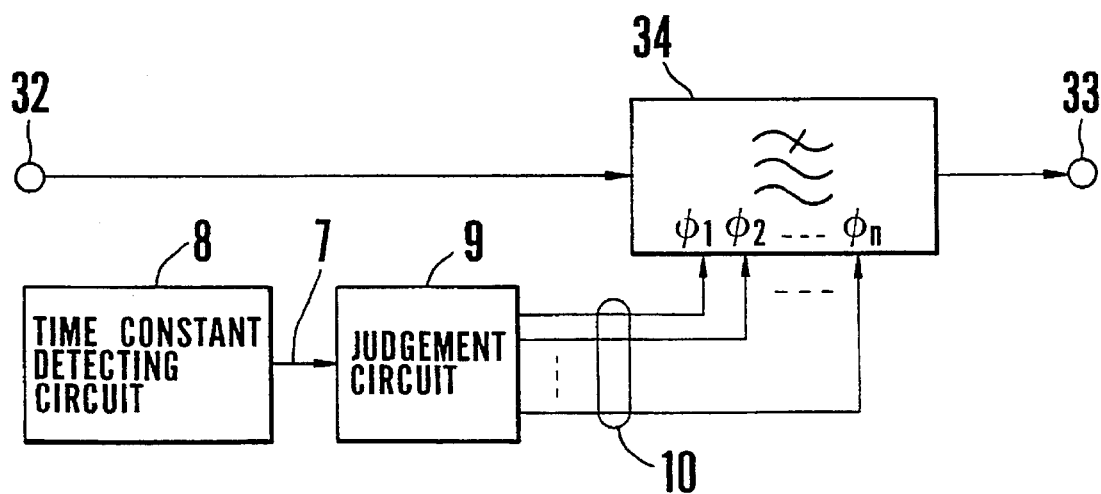
FIG. 4 is a time constant adjusting circuit according to an embodiment of the present invention.

Referring to FIG. 4, there is exemplarily illustrated a time constant adjusting circuit for adjusting such a time constant using the time constant detecting circuit described above.

In FIG. 4, designated at 34 is an RC active filter which is incorporated in an LSI for filtrating an input signal through an input terminal 32 with a predetermined cutoff frequency and outputting the same from an output terminal 33. In order to adjust the cutoff frequency of the active filter 34 there are assembled a time constant detecting circuit 8 and a judgement circuit 9 in the LSI. In this case, the active filter 34 is constructed with some additional functions.

The judgement circuit 9 receives a detected voltage (foregoing output voltage Vout) appearing at the output terminal 7 of the time constant detecting circuit 8 to judge how the time constant $\tau$ is varied and send a plurality of control signals 10 indicative of a judgement result to control input terminals ($\phi_1$ through $\phi_n$) of the active filter 34. The judgement circuit 9 may be constructed with an A/D converter or may be constructed simply with a combination of a plurality of voltage comparators and a logic circuit.

Figure 5:
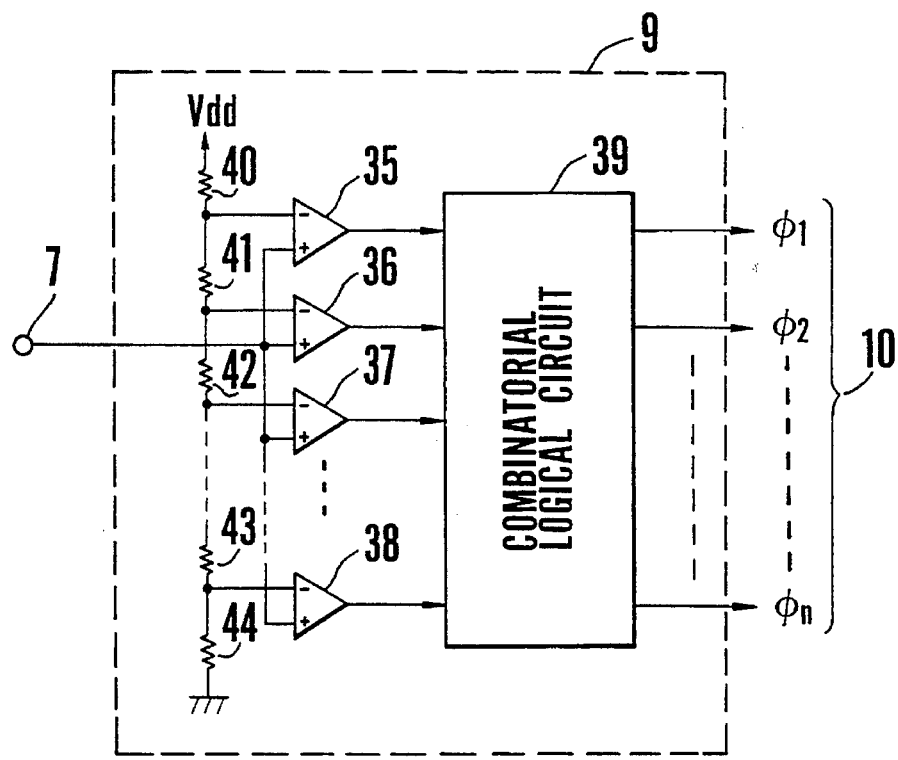
FIG. 5 is a circuit diagram exemplarily illustrating a judgement circuit illustrated in FIG. 4.

Referring to FIG. 5, there is exemplarily illustrated the judgement circuit 9 constructed with the just-mentioned combinatorial circuit.

In FIG. 5, designated at 35 through 38 are comparators which have reference values defined by voltage dividing resistors 40 through 44, 39 is a combinatorial logic circuit for processing outputs from the comparators 35 through 38 which comprises AND circuits and NOR circuits.

An output from the time constant detecting circuit 8 (illustrated in FIG. 1 or FIG. 3) taken out at the output terminal 7 is compared by the comparators 35 through 38 with the respective reference voltages generated by dividing the power supply voltage Vdd with the voltage dividing resistors 40 through 44. Outputs from the comparators 35 through 38 are processed with a predetermined logic by the combinatorial circuit 39 and outputted as control signals $\phi_1$, $\phi_2, \ldots, \phi_n$.

Returning here to FIG. 4, the active filter 34 alters element values of the associated resistors and capacitors in response to the control signal 10. Hereby, the active filter 34 is automatically adjusted such that it approaches a predetermined cutoff frequency to the utmost. This is the additional function of the active filter 34 added thereto. A concrete example thereof will be described with reference to FIG. 6.

Figure 6:
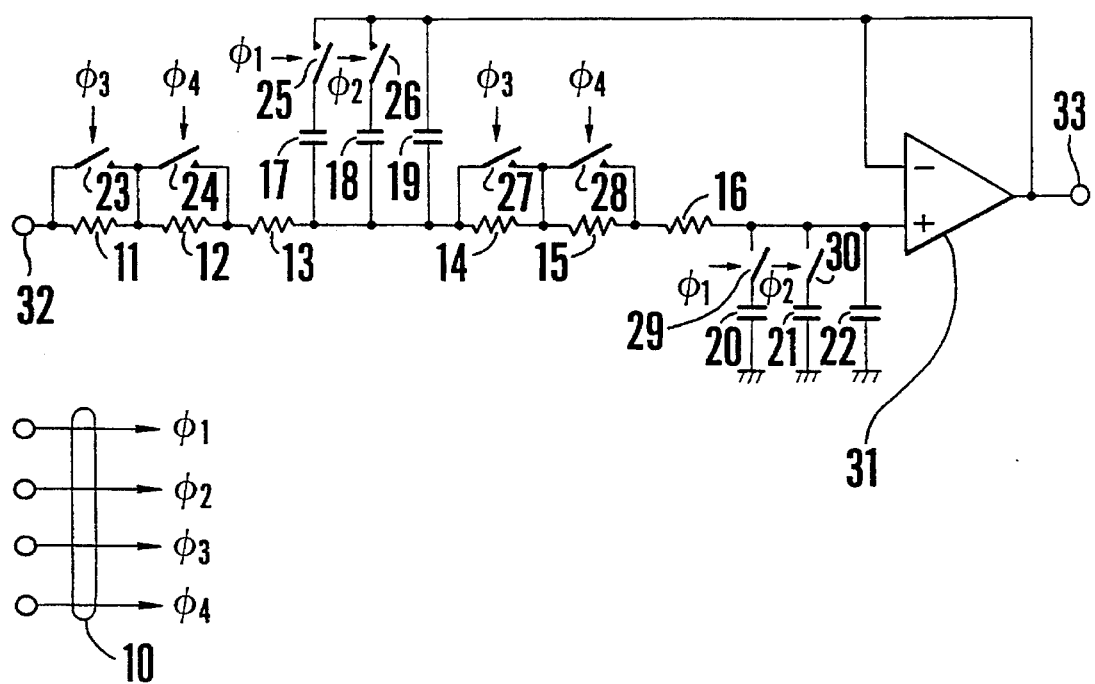
FIG. 6 is a circuit diagram exemplarily illustrating an active filter having an adjusting function.

FIG. 6 exemplarily illustrates the arrangement of a secondary RC active low-pass filter for finely adjusting the cutoff frequency.

In FIG. 6, designated at 31 is an operational amplifier as a main component, on the input side of which there are disposed resistors 13, 16 and capacitors 19, 22 required essentially, and further resistors 11, 12, 14, 15 with which short-circuiting switches 23, 24, 27, 28 are disposed in parallel, respectively, and capacitors 17, 18, 19, 20, 30, which switches are opened and closed by the four control signals $\phi_1$ through $\phi_4$ 10.

In the illustrated example, the switches 25, 29 are opened and closed by $\phi_1$ of the control signals 10 to connect and disconnect the capacitors 17, 20, the switches 26, 30 are opened and closed by $\phi_2$ to connect and disconnect the capacitors 18, 21, the switches 23, 27 are opened and closed to short-circuit and connect the resistors 11, 14, and the switches 24, 28 are opened and closed by $\phi_4$ to short-circuit and connect the resistors 12, 15.

In accordance with the time constant detecting circuit of the present invention, as described above, predetermined DC voltage is divided by the series circuit of the pseudo-resistor constructed with the switched capacitor circuit and of the ordinary resistor, and mean voltage of the divided voltages is outputted.

Accordingly, the output voltage can uniquely be determined by a time constant defined by the capacitor in the switched capacitor circuit and the ordinary resistor to enable the variations of element values of resistors and capacitors formed in an LSI to be detected as the variations of the time constant.

In accordance with the time constant adjusting circuit of the present invention, the variations of a time constant of a circuit including resistors and capacitors as constituent elements can automatically and finely be adjusted to enable a filter with less variations of its cutoff frequency to be formed in an LSI.

What is claimed is:

1. A time constant detecting circuit incorporated in an LSI, as part of an associated circuit, the time constant detecting circuit comprising:

a resistance voltage dividing circuit including:

a pseudo-resistor formed by a switched capacitor circuit having a capacitor having one end connected to a ground and an ordinary resistor connected in series With said pseudo-resistor for dividing an applied predetermined DC voltage; and a smoothing capacitor for smoothing voltage divided by said resistance dividing circuit.

2. A time constant detecting circuit according to claim 1, wherein said capacitor of said pseudo-resistor has first and second ends, said first end of said capacitor being connected to the ground, two analog switches being connected with said second end of said capacitor, a terminal of one of the analog switches is grounded and a terminal of the other analog switch is connected with a junction between said ordinary resistor and said smoothing capacitor, said two analog switches being controlled such that when one of said two analog switches is switched on, the other of said two analog switches is switched off.

3. A time constant adjusting device comprising:

a time constant detecting circuit including:

a time constant detecting circuit incorporated in an LSI, as part of an associated circuit, the time constant detecting circuit comprising:

a resistance voltage dividing circuit including a pseudo-resistor formed by a switched capacitor circuit including a capacitor having one end connected to a ground and an ordinary resistor connected in series with said pseudo-resistor for dividing an applied predetermined DC voltage and a smoothing capacitor for smoothing voltage divided by said resistance dividing circuit;

a judgement circuit for judging a range of a voltage output from said time constant detecting circuit and outputting a control signal in response to said range judged by said judgement circuit; and means provided in a circuit which includes resistors and capacitors for receiving said control signal and for altering element values of the corresponding resistors and capacitors.

4. A time constant adjusting circuit according to claim 3 wherein said judgement circuit comprises a plurality of comparators each having different reference values and a logic circuit for processing outputs from said comparators in conformity with a predetermined logic.

5. The time constant detecting circuit of claim 1, wherein said ordinary resistor is arranged in said resistance voltage dividing circuit to receive said applied predetermined DC voltage.

6. The time constant detecting circuit of claim 1, wherein said switched capacitor circuit is arranged in said resistance voltage dividing circuit to receive said applied predetermined DC voltage.

7. The time constant detecting circuit of claim 1, wherein said smoothing capacitor has a first end connected to a ground and a second end connected to a junction between said ordinary resistor and said switched capacitor circuit.

8. The time constant detecting circuit of claim 1, wherein a terminal of one of the analog switches is positioned to receive said applied predetermined DC voltage and a terminal of the other analog switch is connected with said smoothing capacitor.

9. A time constant detecting circuit for use in an LSI, as part of an associated circuit, the time constant detecting circuit comprising:

a resistance voltage dividing circuit including: a pseudo-resistor formed by a switched capacitor circuit including a capacitor having one end connected to a ground and an ordinary resistor connected in series with Said pseudo-resistor for dividing an applied predetermined DC voltage: and a smoothing capacitor for smoothing voltage divided by said resistance dividing circuit; wherein the output voltage output by the resistance voltage dividing circuit and smoothed by the smoothing capacitor is defined by a time constant, variations in the time constant being dependent on resistors and capacitors provided in the LSI so that variations in resistances of the resistors and capacitances of the capacitors in the LSI can be determined by detecting variations in the time constant.

10. The time constant detecting circuit of claim 1, wherein said ordinary resistor has a first end connected to a ground.

11. A circuit for use in an LSI having resistors and capacitors, the circuit comprising:

a) a resistance voltage dividing circuit for receiving an input power supply and dividing said input power supply;

b) a smoothing capacitor for smoothing an output voltage output by said resistance voltage dividing circuit; and c) a controller for controlling operation of the resistance voltage dividing circuit so as to output an output voltage, wherein the output voltage output by the resistance voltage dividing circuit and smoothed by the smoothing capacitor is defined by a time constant and variations in the time constant being dependent on the resistors and capacitors in the LSI so that variations in resistances of the resistors and capacitances of the capacitors in the LSI can be determined by detecting variations in the time constant.

12. The circuit of claim 11, wherein the resistance voltage dividing circuit comprises a pseudo-resistor including a capacitor, a first analog switch, and a second analog switch, wherein said controller controls said first and second switches to control charging and discharging of the capacitor such that when one of said first and second switches is switched on, the other of said first and second switches is switched off.

13. The circuit of claim 12, wherein the resistance voltage dividing circuit further comprises a resistor connected in series with said pseudo-resistor.

14. An electronic component comprising:
   a) an RC active filter having at least one resistor and at least one capacitor;
   b) a time constant detecting circuit for receiving an input power supply and dividing said input power supply to output an output voltage; and
   c) a judgement circuit for judging a range of voltage output from said time constant detecting circuit and outputting a control signal to the RC active filter for altering a value of at least one of a resistance and a capacitance of the RC active filter.

15. The electronic component of claim 14, further comprising means for receiving said control signal from said judgement circuit and for altering the value of at least one of the resistance and the capacitance of the RC active filter.

16. The electronic component of claim 15, wherein said means for receiving said control signal from said judgement circuit and for altering the value of at least one of the resistance and the capacitance of the RC active filter adjusts a cutoff frequency of the RC active filter to a desired cutoff frequency.

17. The electronic component of claim 14, wherein said output voltage output from said time constant detecting circuit is defined by a time constant and variations in the time constant are dependent on the at least one resistor and the at least one capacitor so that variations in the value of at least one of the resistance and the capacitance of the RC active filter can be determined by detecting variations in the time constant.

18. The electronic component of claim 14, wherein said time constant detecting circuit comprises a resistance voltage dividing circuit for receiving the input power supply and dividing said input power supply and a smoothing capacitor for smoothing an output voltage output by said resistance voltage dividing circuit.

19. The electronic component of claim 18, wherein said resistance voltage dividing circuit comprises a pseudo-resistor including a capacitor, a first analog switch, a second analog switch, a controller for controlling said first and second switches to control charging and discharging of the capacitor such that when one of said first and second switches is switched on, the other of said first and second switches is switched off and a resistor connected in series with said pseudo-resistor.

20. The electronic component of claim 14, wherein the judgement circuit comprises a plurality of comparators each having different reference values and a logic circuit for processing outputs from said comparators.

\* \* \* \* \*